United States Patent
Joo et al.

(10) Patent No.: US 9,997,856 B2
(45) Date of Patent: Jun. 12, 2018

(54) AC SOCKET, POWER CORD AND DISPLAY APPARATUS HAVING THE SAME

(71) Applicant: SAMSUNG ELECTRONICS CO., LTD., Suwon-si, Gyeonggi-do (KR)

(72) Inventors: Sung Yong Joo, Yongin-si (KR); Jin Hyung Lee, Anyang-si (KR); Seok Yeol Chun, Suwon-si (KR)

(73) Assignee: SAMSUNG ELECTRONICS CO,. LTD., Suwon-si (KR)

( * ) Notice: Subject to any disclaimer, the term of this patent is extended or adjusted under 35 U.S.C. 154(b) by 4 days.

(21) Appl. No.: 14/953,888

(22) Filed: Nov. 30, 2015

(65) Prior Publication Data
US 2016/0156118 A1    Jun. 2, 2016

(30) Foreign Application Priority Data

Dec. 2, 2014   (KR) .................. 10-2014-0170497
Dec. 4, 2014   (KR) .................. 10-2014-0172859
Mar. 13, 2015  (KR) .................. 10-2015-0035189

(51) Int. Cl.
*H01R 13/73*   (2006.01)
*H01R 13/40*   (2006.01)
(Continued)

(52) U.S. Cl.
CPC ....... *H01R 13/40* (2013.01); *G02F 1/133308* (2013.01); *H01R 12/716* (2013.01); *H05K 5/0017* (2013.01); *H05K 5/0026* (2013.01); *H05K 5/0247* (2013.01); *G02F 2001/133314* (2013.01); *G06F 1/16* (2013.01); *H01R 9/2491* (2013.01); *H01R 12/7076* (2013.01); *H01R 13/5213* (2013.01); *H01R 24/76* (2013.01);
(Continued)

(58) Field of Classification Search
CPC . H01R 12/716; H01R 13/5213; H01R 9/2491
See application file for complete search history.

(56) References Cited

U.S. PATENT DOCUMENTS

| 4,718,853 A * | 1/1988 | Orbanic ............... H01R 29/00 200/292 |
| 6,733,334 B2 * | 5/2004 | Chen ..................... H05K 3/308 439/554 |

(Continued)

FOREIGN PATENT DOCUMENTS

| EP | 2 139 079 A2 | 12/2009 |
| EP | 2 139 079 A3 | 10/2011 |

(Continued)

OTHER PUBLICATIONS

Extended European Search Report dated Apr. 28, 2016 in corresponding European Patent Application No. 15194873.4.
(Continued)

*Primary Examiner* — Tho D Ta
(74) *Attorney, Agent, or Firm* — Staas & Halsey LLP

(57) ABSTRACT

A display apparatus in which a height of an AC socket protruding to a rear side of a printed circuit board is reduced and a power cord is provided to be in close contact with a product to provide a display apparatus in which a creeping distance is increased to prevent the printed circuit board from being damaged by a high voltage or a stroke of lightning.

22 Claims, 18 Drawing Sheets

(51) Int. Cl.
  *H05K 5/00* (2006.01)
  *H05K 5/02* (2006.01)
  *G02F 1/1333* (2006.01)
  *H01R 12/71* (2011.01)
  *H01R 13/52* (2006.01)
  *H01R 9/24* (2006.01)
  *H01R 12/70* (2011.01)
  *H01R 24/76* (2011.01)
  *H04N 5/63* (2006.01)
  *H04N 5/64* (2006.01)
  *H05K 1/18* (2006.01)
  *G06F 1/16* (2006.01)

(52) U.S. Cl.
  CPC .......... *H04N 5/63* (2013.01); *H04N 5/64* (2013.01); *H05K 1/185* (2013.01); *H05K 2201/09754* (2013.01); *H05K 2201/10325* (2013.01)

(56) References Cited

U.S. PATENT DOCUMENTS

| | | |
|---|---|---|
| 7,128,599 B1 | 10/2006 | Ho |
| 2012/0077356 A1 | 3/2012 | Shimizu et al. |
| 2015/0009652 A1* | 1/2015 | Alexander ............ H01R 35/04 362/95 |

FOREIGN PATENT DOCUMENTS

| | | |
|---|---|---|
| JP | 2002-298948 | 10/2002 |
| WO | 2005/122338 A1 | 12/2005 |

OTHER PUBLICATIONS

European Office Action dated Mar. 31, 2017 in European Patent Application No. 15194873.4.

Communication under Rule 71(3) dated Nov. 21, 2017 in corresponding European Patent Application No. 15 194 873.4, 52 pages.

* cited by examiner

AC SOCKET, POWER CORD AND DISPLAY APPARATUS HAVING THE SAME

CROSS-REFERENCE TO RELATED APPLICATION

This application claims the benefit of Korean Patent Application Nos. 2014-0170497, 2014-0172859 and 2015-0035189, filed on Dec. 2, 2014, Dec. 4, 2014 and Mar. 13, 2015, respectively, in the Korean Intellectual Property Office, the disclosure of which is incorporated herein by reference.

BACKGROUND

1. Field

Embodiments relate to a slim AC socket, a power cord, and a display apparatus having the same.

2. Description of the Related Art

Electronic devices such as a mobile phone, a notebook and a display apparatus are activated by receiving a power supply from an external power supply source. The electronic devices may receive the power supply through a power cord connected with the external power supply source.

A power cord may include a cable and a plug coupled to an end of the cable. The power cord may protrude from a rear surface or a side surface of a case of an electronic product and then may be removably connected to the external power supply source.

A printed circuit board assembly may be provided at each of the electronic devices. The printed circuit board assembly includes a printed circuit board, electronic components mounted on the printed circuit board, and a connector which connects the printed circuit board with an external electronic device. The electronic components may be mounted on both opposed surfaces of the printed circuit board.

An AC socket may be provided at one side of the printed circuit board. The plug connected with the external power supply source may be connected to the AC socket. The plug may be removably connected with the AC socket. A connection portion between the AC socket and the plug may be manufactured according to a predetermined standard for each country. The AC socket protrudes to a rear side of the printed circuit board. A connection terminal of the AC socket may be exposed to an outside through a hole formed at a rear cover to be connected with the plug.

SUMMARY

Therefore, it is an aspect to provide a display apparatus in which a height of an AC socket protruding to a rear side of a printed circuit board is reduced. Also, it is an aspect to provide a display apparatus in which a creeping distance is increased to prevent the printed circuit board from being damaged by a high voltage or a stroke of lightning.

Also, it is still another aspect to provide a power cord whose length protruding from an electronic device is minimized to enhance an external appearance of the electronic device. Also, it is possible to enhance coherence between an electronic product and the power cord. Also, a movement of the power cord is prevented, and thus it is possible to prevent an arc generated by an external influence. Also, it is possible to enhance a durability of the power cord.

Additional aspects will be set forth in part in the description which follows and, in part, will be obvious from the description, or may be learned by practice of the embodiments.

In accordance with one aspect, an AC socket which is mounted on a printed circuit board provided at a display apparatus includes a socket body having a step portion formed along an outer circumference of a rear surface of the socket body so that a rear cover of the display apparatus is seated thereon; a connection terminal provided at the socket body; and a connection member configured to connect the connection terminal with a circuit pattern provided at the printed circuit board.

A partition configured to protrude to a rear side may be provided at the rear surface of the socket body.

The connection terminal may include a first connection terminal, and a second connection terminal provided to be spaced from the first connection terminal, and the partition may be provided at one side of the first connection terminal or the second connection terminal.

The partition may be provided between the first connection terminal and the second connection terminal.

The partition may be formed to cover at least a part of an accommodation part in which the first and second connection terminals are located.

The partition may be formed of an insulating material.

The partition may be integrally injection-molded with the socket body using an insulating material.

At least one coupling part through which a fastening member passes may be provided to extend from the socket body.

The coupling part may include a first coupling part provided at a first surface of the socket body and a second surface thereof facing the first surface, and the first coupling part may be coupled to the rear cover by the fastening member.

A partition configured to protrude from the rear surface of the socket body may be provided between the connection terminal and the first coupling part.

The coupling part may include a second coupling part configured to extend from a side surface located between the first and second surfaces of the socket body, and the second coupling part may be coupled to a bottom chassis by the fastening member.

A partition configured to protrude from the rear surface of the socket body may be provided between the connection terminal and the second coupling part.

The rear surface of the socket body may be provided to further protrude toward a rear side than the step portion.

When the socket body is mounted on the printed circuit board, a part of the socket body may protrude to a front side of the printed circuit board.

In accordance with another aspect, a display apparatus includes a display panel configured to display an image; a rear chassis at which the display panel is seated; a printed circuit board provided at a rear side of the rear chassis and having a circuit pattern printed thereon; an AC socket mounted on the printed circuit board; and a rear cover provided at a rear side of the printed circuit board, wherein the AC socket includes a socket body having a step portion formed along an outer circumference of a rear surface of the socket body so that the rear cover is seated thereon to prevent a movement of the rear cover; a connection terminal provided at the rear surface of the socket body; a coupling part configured to extend from a side surface of the socket body and to be coupled to the rear chassis or the rear cover; and a connection member configured to connect the connection terminal with the circuit pattern provided at the printed circuit board.

A partition may be formed at the rear surface of the socket body to cover at least a part of an accommodation part in which the connection terminal is located.

The partition may be integrally injection-molded with the socket body using an insulating material.

The connection terminal may include a first connection terminal, and a second connection terminal formed to be spaced from the first connection terminal, and a partition formed of an insulation material may be provided between the first and second connection terminals.

A clamp fixed to the printed circuit board may be provided at the socket body.

The rear cover may have a hole, and the connection terminal provided at the socket body may be exposed to an outside through the hole.

In accordance with one aspect, a power connector for an electronic device includes a first power connection terminal, a second power connection terminal spaced apart from the first terminal by a distance set by a country standard, and a partition between the first power connection terminal and the second power connection terminal and having a surface distance extending along any surface between the first power connection terminal and the second power connection terminal greater than a space distance between first power connection terminal and the second power connection terminal set by a country standard. The partition may have a "y" shape.

The surface distance may be a creeping distance.

The connector may also include a first fastening member adjacent the first power connection terminal and a rib between the first fastening member and the first power connection terminal increasing the creeping distance between the first fastening member and the first power connection terminal.

The creeping distance may be longer than a space distance.

A size of the connector may be reduced relative to the country standard.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Hereinafter, an AC socket, a power cord, and a display apparatus having the same according to one embodiment will be described in detail with reference to the accompanying drawings.

Figure 1:
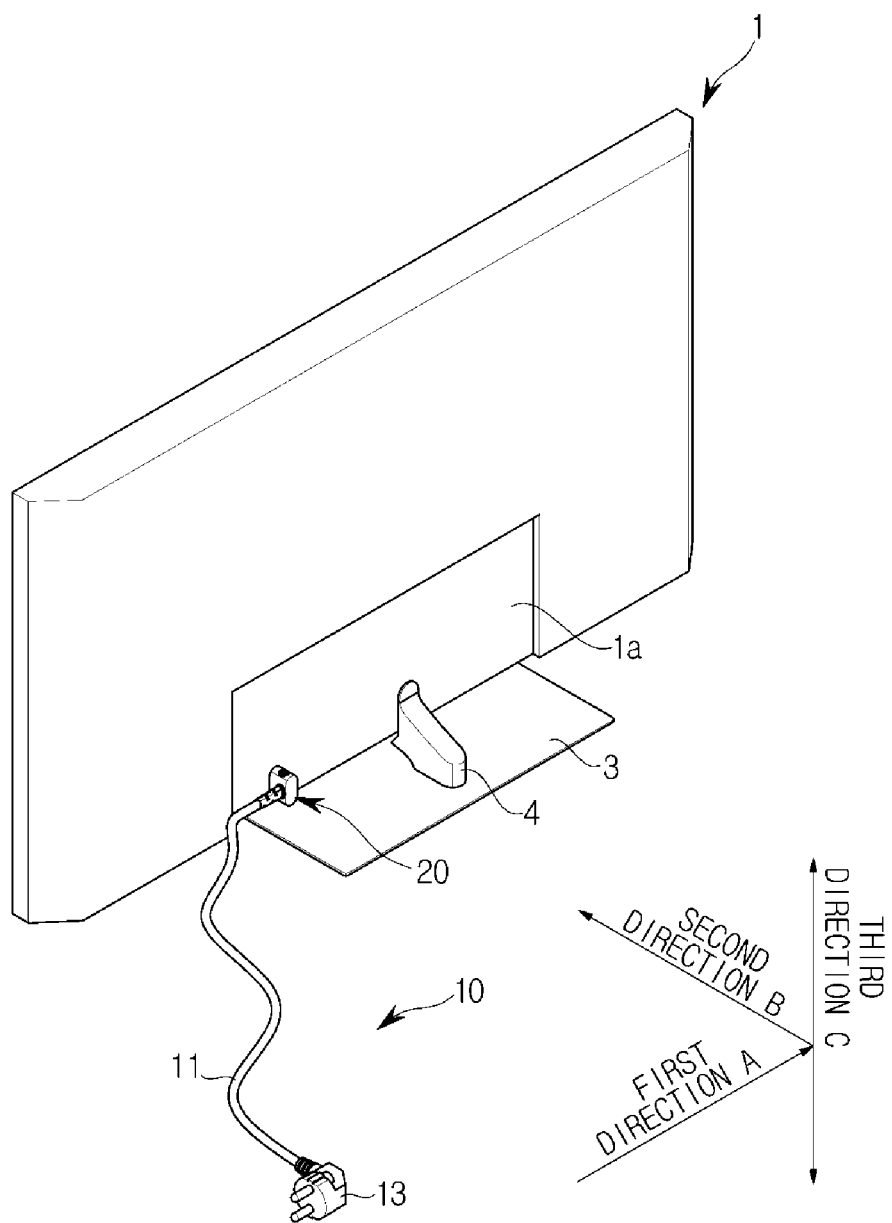
FIG. 1 is a view illustrating a state in which a power cord is installed at a display apparatus according to one embodiment.
Figure 2:
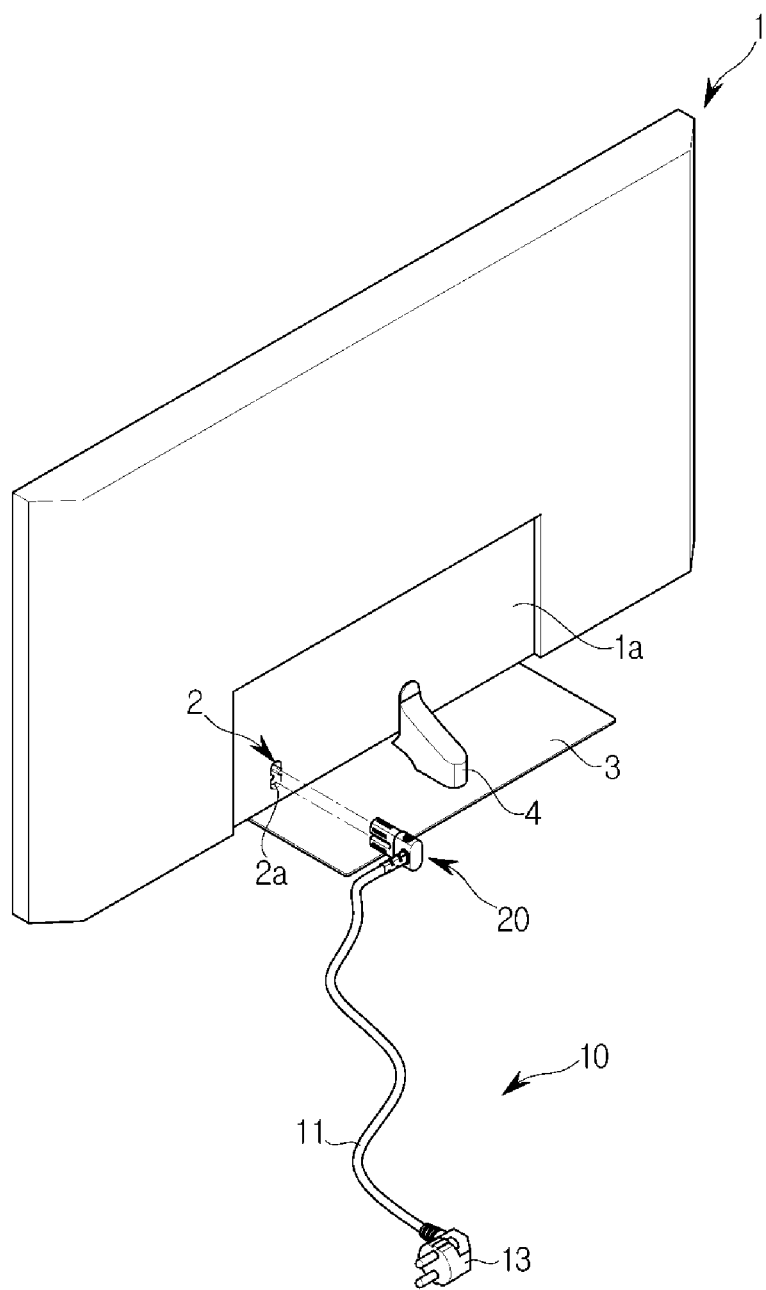
FIG. 2 is a view illustrating a state in which the power cord is separated from the display apparatus according to one embodiment.

As illustrated in FIGS. 1 and 2, a display apparatus 1 provided to display an image includes a display panel 200 (referring to FIG. 12) which displays image information, and a rear cover 1a which protects the display panel 200 and internal electronic components from an outside of the display panel 200.

The rear cover 1a may be provided to form an exterior of a rear surface of the display apparatus 1. The one embodiment illustrates an example in which the rear cover 1a is integrally formed to cover a front edge and the rear surface of the display apparatus 1. However, the spirit of the embodiments is not limited thereto. For example, the rear cover 1a may be independently formed to be separable from four edges of the display apparatus 1.

The rear cover 1a forms the rear surface of the display panel, and serves to protect the display apparatus 1 from an external shock, dust, moisture or the like.

A power cord 10 for supplying power is provided at the display apparatus 1. The power cord 10 may be provided to be removably connected to the display apparatus.

The display apparatus 1 is supported by a stand 3. The stand 3 may include a connection part 4 which is connected with a rear surface of the rear cover 1a.

Meanwhile, an installation part 2 to which the power cord 10 is connected is provided at the rear surface of the rear cover 1a of the display apparatus 1. The installation part 2 may include a hole 2a which is formed to pass therethrough so that a socket 60 connected to a connector 20 of the power cord 10 is exposed to an outside of the rear cover 1a.

The embodiment has described an example in which the installation part 2 is formed to pass through the rear cover 1a of the display apparatus 1. However, the spirit of the embodiments is not limited thereto. For example, the installation part 2 may be formed to be recessed from the rear cover 1a by a predetermined depth.

The power cord 10 for supplying the power to the display apparatus 1 includes a cable 11, a plug 13 which is connected to one end of the cable 11, and the connector 20 which is connected to the other end of the cable 11.

The cable 11 may be formed by coating a plurality of wires 11a and 11b through which a current flows.

The plug 13 is connected to one end of the cable 11. The plug 13 is provided to be connected to an external power source through an outlet (not shown) and thus to connect or disconnect an electric circuit.

The connector 20 is connected to the other end of the cable 11. The connector 20 may be provided to be coupled to the installation part 2 of the display apparatus 1.

Figure 3A:
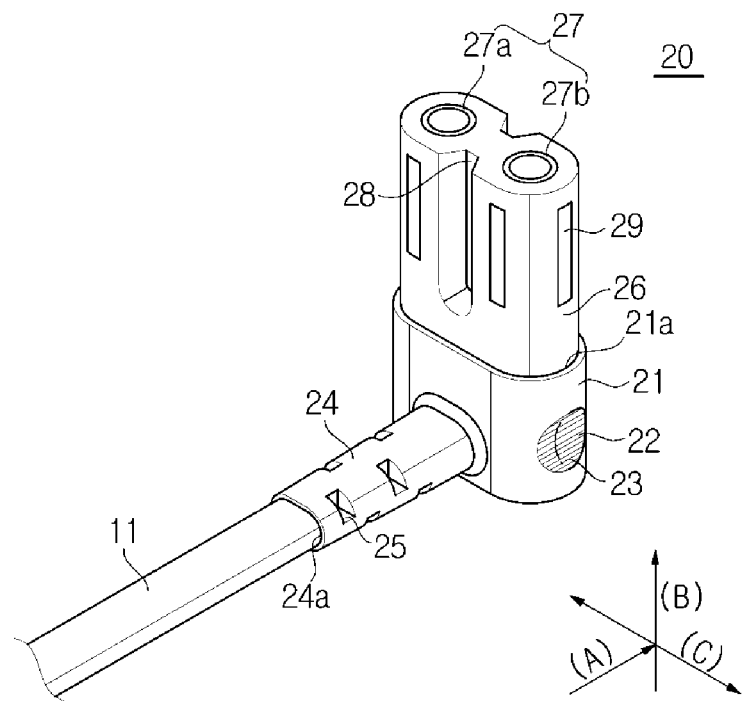
FIG. 3A is a perspective view illustrating a connector of the power cord according to one embodiment.
Figure 3B:
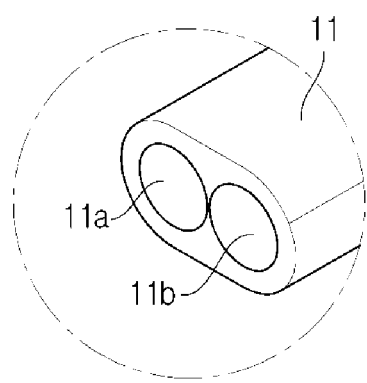
FIG. 3B is a view illustrating a cross section of a cable according to one embodiment.
Figure 4:
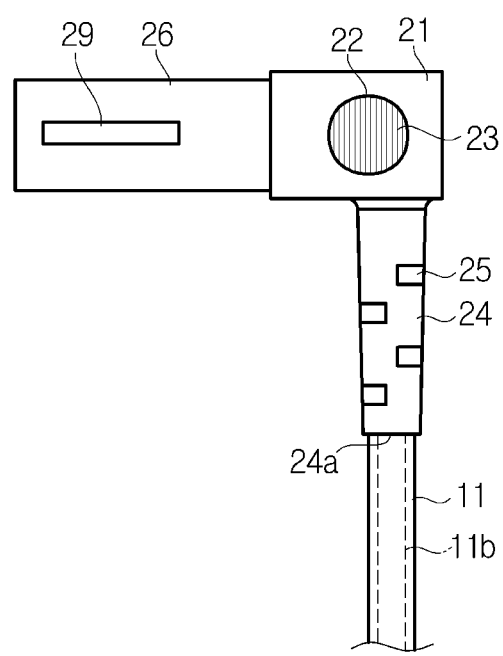
FIG. 4 is a side view illustrating the connector of the power cord according to one embodiment.
Figure 5:
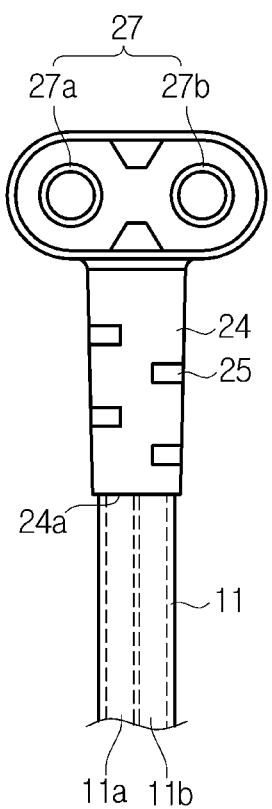
FIG. 5 is a front view illustrating the connector of the power cord according to one embodiment.

FIG. 3A is a perspective view illustrating the connector of the power cord according to one embodiment, FIG. 3B is a view illustrating a cross section of the cable according to one embodiment, FIG. 4 is a side view illustrating the connector of the power cord according to one embodiment, and FIG. 5 is a front view illustrating the connector of the power cord according to one embodiment.

As illustrated in FIGS. 3A to 5, the connector 20 of the power cord 10 includes a cable connection part 24 in which the cable 11 is inserted, a head 21 which is connected with the cable connection part 24, and a connection terminal part 27 which is connected with the head 21.

The connector 20 includes the cable connection part 24 which is formed in a first direction A to which the cable 11 is inserted and connected, the head 21 which is connected to the cable connection part 24 and formed in a second direction B perpendicular to the first direction A, and the connection terminal part 27 which is connected from the head 21, provided to be inserted into the installation part 2, and formed in a third direction C different from the first direction A and the second direction B.

The connector 20 may be formed to have an approximate "L" shape by order of the connection terminal part 27, the head 21 and the cable connection part 24 formed to be bent downward from the head 21.

The head 21 of the connector 20 has an elliptical exterior of which a front surface is opened, and the connection terminal part 27 is provided at a front surface opening 21a. The cable connection part 24 is provided at a lower surface of the head 21. The embodiment has described an example of the connector 20 having a cylindrical shape of which the front surface is opened and a rear surface is closed, upper and lower surfaces are flat, both side surfaces are formed in a semicircular shape, and in which the cable connection part 24 passes through and is connected to a lower surface thereof. However, the spirit of the embodiments is not limited thereto. For example, the head of the connector may have a rectangular or square shape of which both side surfaces are flat.

The cable connection part 24 is formed so that the cable 11 which is in communication with the head 21 and inserted through the cable connection part 24 is connected to connection terminals 27a and 27b of the connection terminal part 27 through an inside of the head 21.

The cable connection part 24 is provided so that the wires 11a and 11b are connected with the head 21 through the lower surface of the head 21 and pass through the head 21. The embodiments have been described using an example in which the cable connection part 24 is integrally formed at the lower surface of the head 21. However, the cable connection part 24 and the head 21 may be formed to be separable from each other.

The cable connection part 24 is formed in a hollow tube shape, and one end thereof is connected to the head 21, and the other end is opened to have a wire insertion hole 24a in which the wires 11a and 11b are inserted.

A groove 25 is provided at an outer circumferential surface of the cable connection part 24 to enhance flexibility of the cable connection part 24. The groove 25 is formed to have a predetermined length in a circumferential direction. At least one or more, or a plurality of grooves 25 may be provided.

Therefore, the cable 11 connected with the head 21 through the cable connection part 24 may be flexibly connected with the head 21 due to the groove 25. The flexibility of the cable connection part 24 may allow a smooth movement of the cable 11, and thus may allow the cable 11 to be flexible in responding to an external shock.

The cable connection part 24 may be connected upward from the lower surface of the head 21 in the first direction A. The head 21 is formed in the second direction B which is bent perpendicularly to the first direction A. At this time, the second direction B coincides with an insertion direction to which the connection terminal part 27 is inserted into the installation part 2. The connection terminal part 27 is connected from the front surface opening 21a in the second direction B.

The connection terminal part 27 includes a plurality of connection terminals 27a and 27b. The plurality of connection terminals 27a and 27b include a first connection terminal 27a formed in a cylindrical shape, and a second connection terminal 27b disposed in parallel with the first connection terminal 27a. The first and second connection terminals 27a and 27b are seated at a connection body 28 and then coupled to the head 21.

The embodiment has described an example in which the connection terminals 27a and 27b of the connection terminal part 27 are configured with one pair of first and second connection terminals 27a and 27b. However, the spirit of the embodiments is not limited thereto. For example, a plurality of connection terminals 27a and 27b may be formed according to product specifications.

At this time, the connection terminals 27a and 27b of the connection terminal part 27 are disposed in the third direction C which is different from the first direction A and the second direction B. For example, the first connection terminal 27a and the second connection terminal 27b may be formed in a direction different from the first direction A to which the cable connection part 24 is inserted into the head 21 and the second direction B to which the connection terminals 27a and 27b are inserted into the installation part 2, i.e., in the third direction C in parallel with the connection terminal part 27.

The first connection terminal 27a and the second connection terminal 27b of the connection terminal part 27 are arranged at positions proportional to an arrangement of the wires 11a and 11b of the cable 11. In the wires 11a and 11b of the cable 11, a first wire 11a and a second wire 11b are arranged in parallel with each other in the third direction C. Also, the first connection terminal 27a and the second connection terminal 27b of the connection terminal part 27 are arranged in parallel with each other in the third direction C.

The connection body 28 may be formed in a corresponding shape to be inserted into an installation space 2a of the installation part 2. An indication part 29 may be formed at an outside of the connection body 28 to visually check an insertion depth into the installation space 2a. The indication part 29 may be formed in a lengthwise direction of the connection body 28, i.e., in the second direction B.

When the connection terminal part 27 connected to the head 21 is inserted into the installation space 2a of the installation part 2, a user may grasp an insertion degree by checking presence and absence of the indication part 29 of the connection body 28, and thus the connection terminal part 27 may be prevented from being incompletely inserted.

A grip part 22 which is formed to allow the user to grip the connector 20 is provided at both side surfaces of the head 21. The grip part 22 may be formed at rear ends of the both side surfaces of the head 21 to be recessed inward.

The grip part 22 is provided so that the user connects or separates the power cord 10 with/from the display apparatus 1. The grip part 22 is provided to allow the user to grip the head 21 of the connector 20 and then to insert the connector 20 into the installation part 2.

An anti-slipping portion 23 is formed at the grip part 22 so that the user may easily grip and pull the head 21 from the installation part 2. The anti-slipping portion 23 may include an uneven shape including a groove or a protrusion which is formed at a surface of the head 21.

When the user inserts or separates the head 21 of the connector 20 into/from the installation part 2, the anti-slipping portion 23 may allow the user to stably install and separate the connector 20 without slipping, and thus may enhance usability.

Such a connection structure of the cable 11 and the head 21 may minimize a rear protruding portion of the head 21 of the connector 20, and thus may enhance an external appearance.

Also, the connector 20 may be closely coupled to and stably installed at the installation part 2.

The cable connection part 24 and the head 21 of the connector 20 may be formed of a material having predetermined elasticity, such as rubber and a synthetic resin.

An AC socket 9 to which the connection terminal part 27 of the connector 20 is inserted and coupled will be described later.

Figure 6:
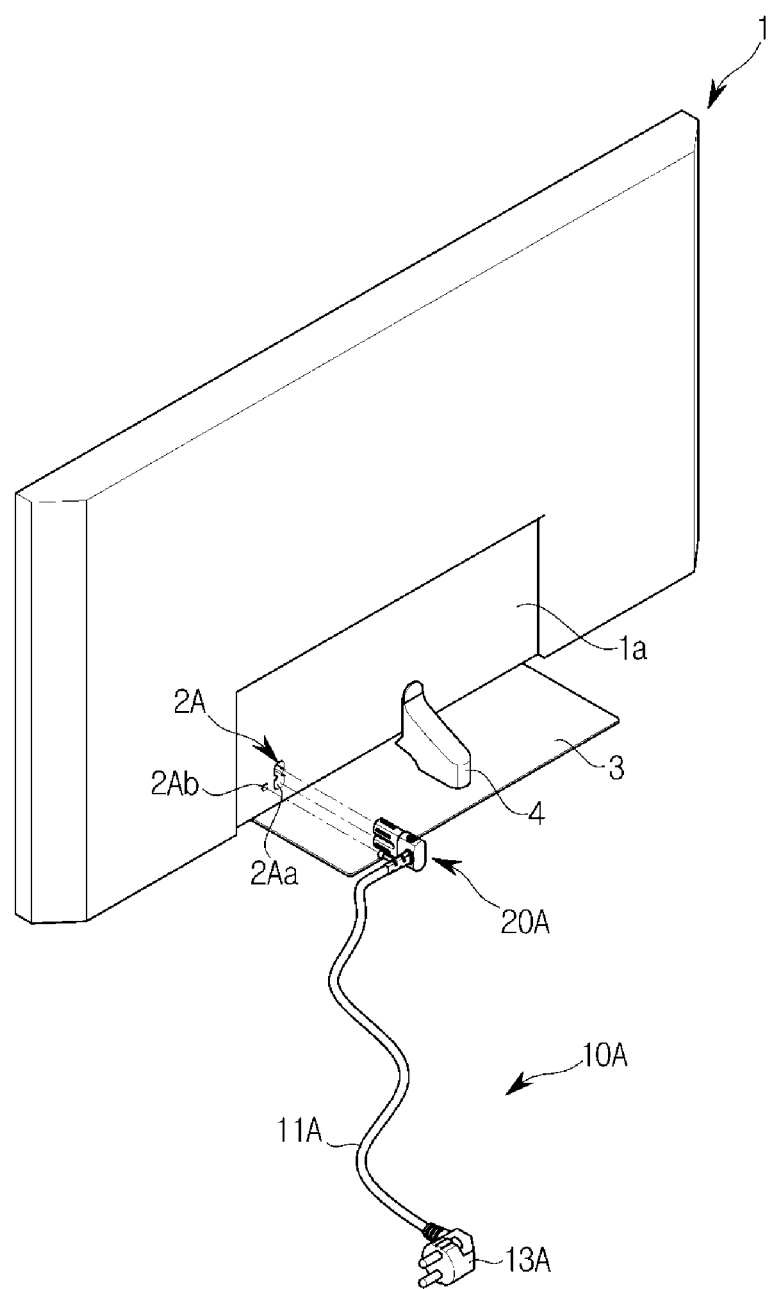
FIG. 6 is an exploded perspective view schematically illustrating a power cord installed at a display apparatus according to another embodiment.
Figure 7:
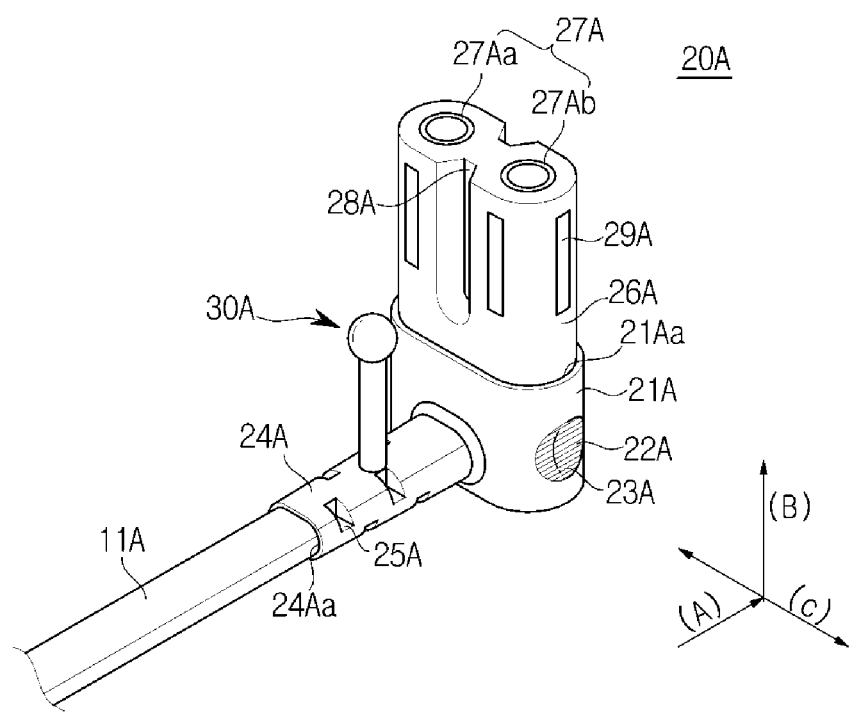
FIG. 7 is a perspective view illustrating a connector of the power cord according to another embodiment.
Figure 8:
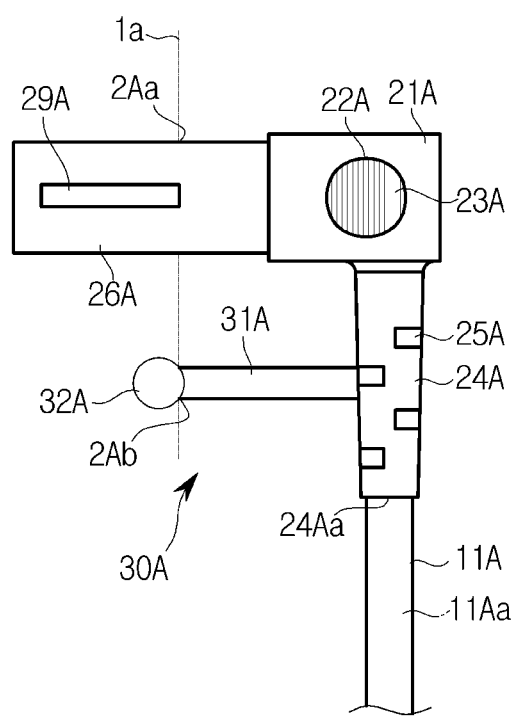
FIG. 8 is a side view illustrating the connector of the power cord according to another embodiment.
Figure 9:
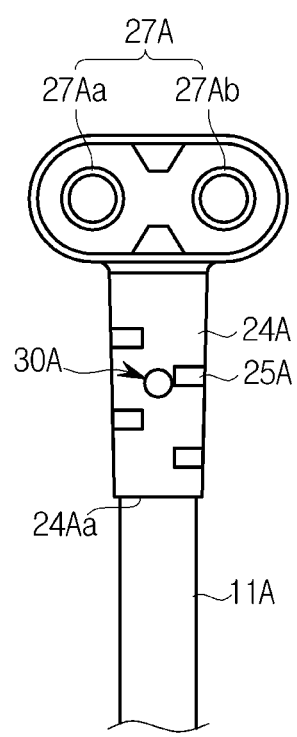
FIG. 9 is a front view illustrating the connector of the power cord according to another embodiment.

FIG. 6 is an exploded perspective view schematically illustrating a power cord installed at a display apparatus according to another embodiment, FIG. 7 is a perspective view illustrating a connector of the power cord according to another embodiment, FIG. 8 is a side view illustrating the connector of the power cord according to another embodiment, and FIG. 9 is a front view illustrating the connector of the power cord according to another embodiment.

As illustrated in FIGS. 6 to 9, a power cord 10A according to another embodiment includes a cable 11A, a plug 13A which is connected to one end of the cable 11A, and a connector 20A which is connected to the other end of the cable 11A.

The connector 20A is connected to the other end of the cable 11A. The connector 20A may be provided to be coupled to an installation part 2A of the display apparatus 1.

The connector 20A includes a cable connection part 24A in which the cable 11A is inserted, a head 21A which is connected with the cable connection part 24A, and a connection terminal part 26A which is connected with the head 21A.

The connector 20A includes the cable connection part 24A which is formed in a first direction A to which the cable 11A is inserted and connected, the head 21A which is connected to the cable connection part 24A and formed in a second direction B perpendicular to the first direction A, and the connection terminal part 26A which is connected from the head 21A, provided to be inserted into the installation part 2A, and formed in a third direction C different from the first direction A and the second direction B.

The connector 20A may be formed to have an approximate "L" shape by order of the connection terminal part 26A, the head 21A and the cable connection part 24A formed to be bent downward from the head 21A.

The head 21A of the connector 20A has an elliptical exterior of which a front surface is opened, and the connection terminal part 26A is provided at a front surface opening 21Aa. The cable connection part 24A is provided at a lower surface of the head 21A.

The cable connection part 24A is formed so that the cable 11A which is in communication with the head 21A and inserted through the cable connection part 24A is connected to a connection terminal 27A of the connection terminal part 26A through an inside of the head 21A.

The embodiments have been described in an example in which the cable connection part 24A is integrally formed at the lower surface of the head 21A. However, the cable connection part 24A and the head 21A may be formed to be separable from each other.

The cable connection part 24A is formed in a hollow tube shape, and one end thereof is connected to the head 21A, and the other end is opened to have a wire insertion hole 24Aa in which the cable 11A is inserted.

A groove 25A is provided at an outer circumferential surface of the cable connection part 24A to enhance flexibility of the cable connection part 24A. The groove 25A is formed to have a predetermined length in a circumferential direction. At least one or more, or a plurality of grooves 25A may be provided.

Therefore, the cable 11A connected with the head 21A through the cable connection part 24A may be flexibly connected with the head 21A due to the groove 25A. The flexibility of the cable connection part 24A may allow a smooth movement of the cable 11A, and thus may allow the cable 11A to be flexible in responding to an external shock.

Meanwhile, a guide protrusion 30A formed to protrude in an insertion direction of the connection terminal part 26A, i.e., in the second direction B is formed at the cable connection part 24A. The guide protrusion 30A is disposed to be spaced downward from the head 21A at a predetermined distance. The guide protrusion 30A may be formed of the same material having the predetermined elasticity as that of the cable connection part 24A, such as the rubber or the synthetic resin.

The guide protrusion 30A may include a cylindrical support part 31A which is connected to the cable connection part 24A, and a spherical fixing protrusion 32A which is formed to protrude from an end of the support part 31A.

A guide hole 2Ab corresponding to the guide protrusion 30A is formed at the rear cover 1a of the display apparatus 1. The guide hole 2Ab may be formed at the rear surface of the rear cover 1a, and may be disposed adjacent to the installation part 2A.

The guide hole 2Ab is disposed to be spaced a predetermined distance from the installation part 2A. The embodiment has described an example in which the guide hole 2Ab is formed so that the fixing protrusion 32A passes therethrough. However, the spirit of the embodiments is not limited thereto. For example, the guide hole 2Ab may be configured with a groove so that the fixing protrusion 32A is inserted and accommodated therein.

The connector 20A may be doubly fixed to the installation part 2A through the guide protrusion 30A coupled to the guide hole 2Ab, and thus may be more stably fixed to the installation part 2A.

The guide protrusion 30A of the connector 20A allows the connector 20A to be firmly coupled to the installation part 2A of the display apparatus 1, and thus may prevent an arc from being generated due to an incomplete insertion of the connector 20A.

Figure 10:
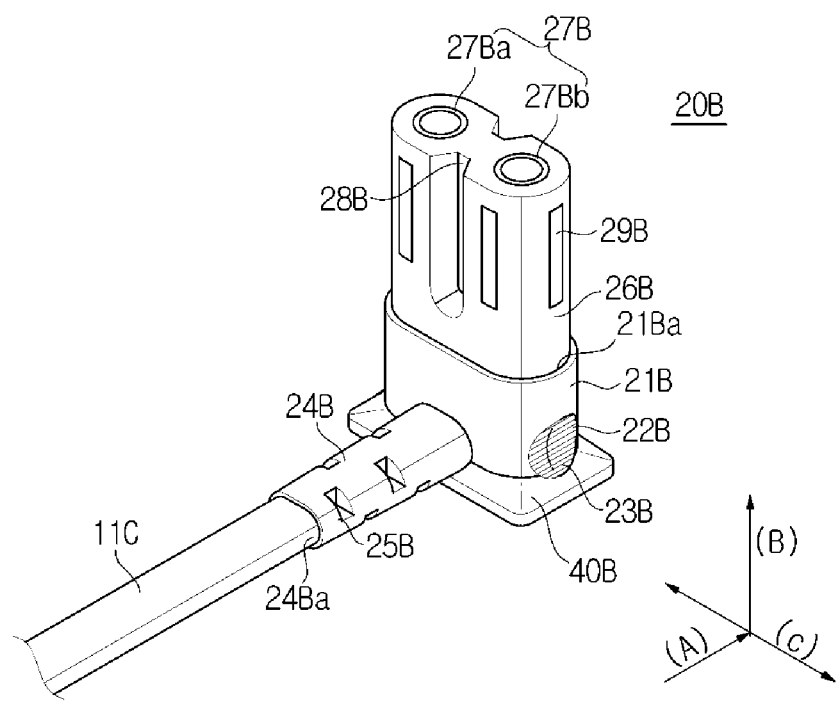
FIG. 10 is a perspective view illustrating a connector of a power cord according to still another embodiment.
Figure 11:
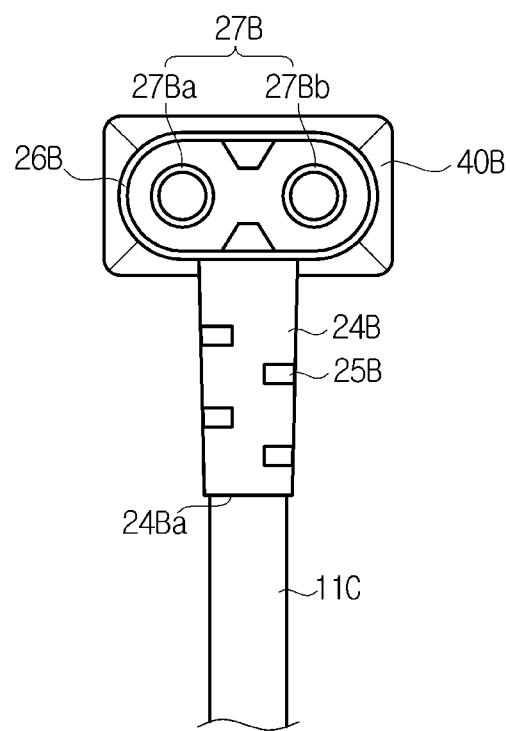
FIG. 11 is a front view illustrating the connector of the power cord according to still another embodiment.

FIGS. 10 and 11 are views illustrating a connector of a power cord according to still another embodiment.

As illustrated in FIGS. 10 and 11, a power cord 10B according to still another embodiment includes a cable 11C, a plug 13 which is connected to one end of the cable 11C, and the connector 20B which is connected to the other end of the cable 11C.

The connector 20B is connected to the other end of the cable 11C. The connector 20B may be provided to be coupled to the installation part 2 of the display apparatus 1.

The connector 20B includes a cable connection part 24B in which the cable 11C is inserted, a head 21B which is connected with the cable connection part 24B, and a connection terminal part 26B which is connected with the head 21B.

The connector 20B includes the cable connection part 24B which is formed in a first direction A to which the cable 11C is inserted and connected, the head 21B which is connected to the cable connection part 24B and formed in a second direction B perpendicular to the first direction A, and the connection terminal part 26B which is connected from the head 21B, provided to be inserted into the installation part 2, and formed in a third direction C different from the first direction A and the second direction B.

The connector 20B may be formed to have an approximate "L" shape by order of the connection terminal part 26B, the head 21B and the cable connection part 24B formed to be bent downward from the head 21B.

The head 21B of the connector 20B has an elliptical exterior of which a front surface is opened, and the connection terminal part 26B is provided at a front surface opening 21Ba. The cable connection part 24B is provided at a lower surface of the head 21B.

The cable connection part 24B is formed so that the cable 11C which is in communication with the head 21B and inserted through the cable connection part 24B is connected to a connection terminal 27B of the connection terminal part 26B through an inside of the head 21B.

Meanwhile, a grip part 22B which is gripped by the user to allow the user to insert or separate the connection terminal part 26B into/from the installation part 2 is provided at the head 21B.

The grip part 22B may be disposed at rear ends of both side surfaces of the head 21B, and may be provided to be recessed inward. An uneven portion 23B for anti-slipping may be formed at the grip part 22B.

Also, the grip part 22B includes a support portion 40B which is formed to protrude outward from a rear surface of the head 21B.

When the connector 20B inserted into the installation part 2 of the display apparatus 1 is separated, the user grips the grip part 22B of the head 21B, and then pulls the connector 20B in a direction opposite to the insertion direction of the connection terminal part 26B, i.e., opposite to the second direction B.

At this time, the user's fingers are caught by the support portion 40B, and thus the connector 20B may be easily separated from the installation part 2, and the user's usability may be enhanced.

Figure 12:
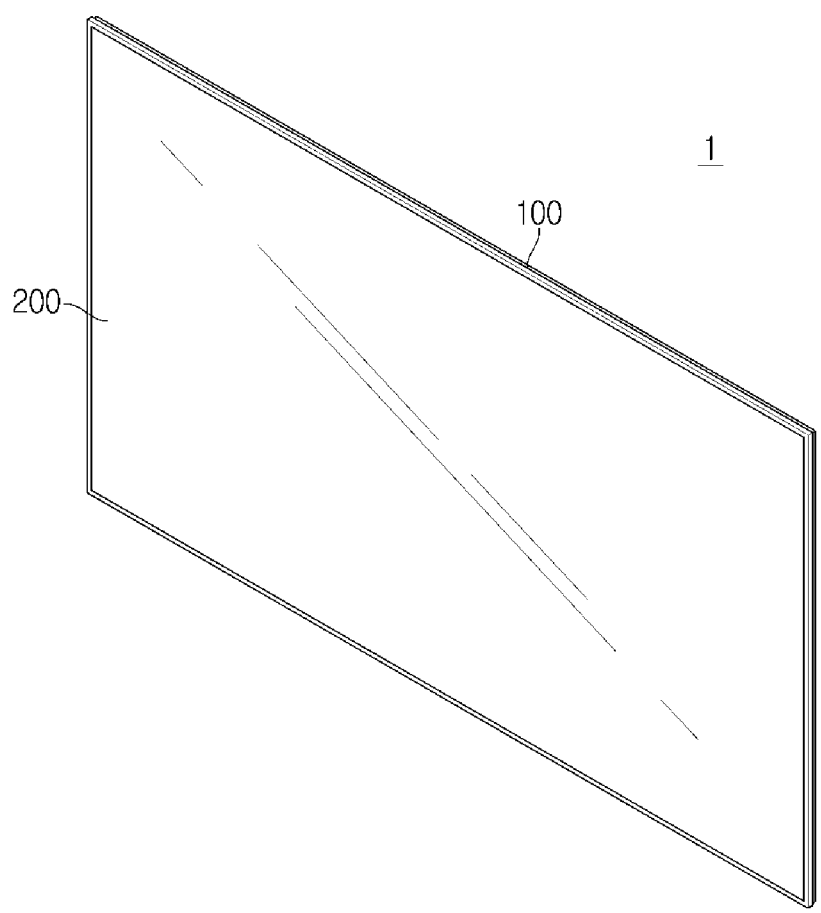
FIG. 12 is a perspective view illustrating the display apparatus according to one embodiment.
Figure 13:
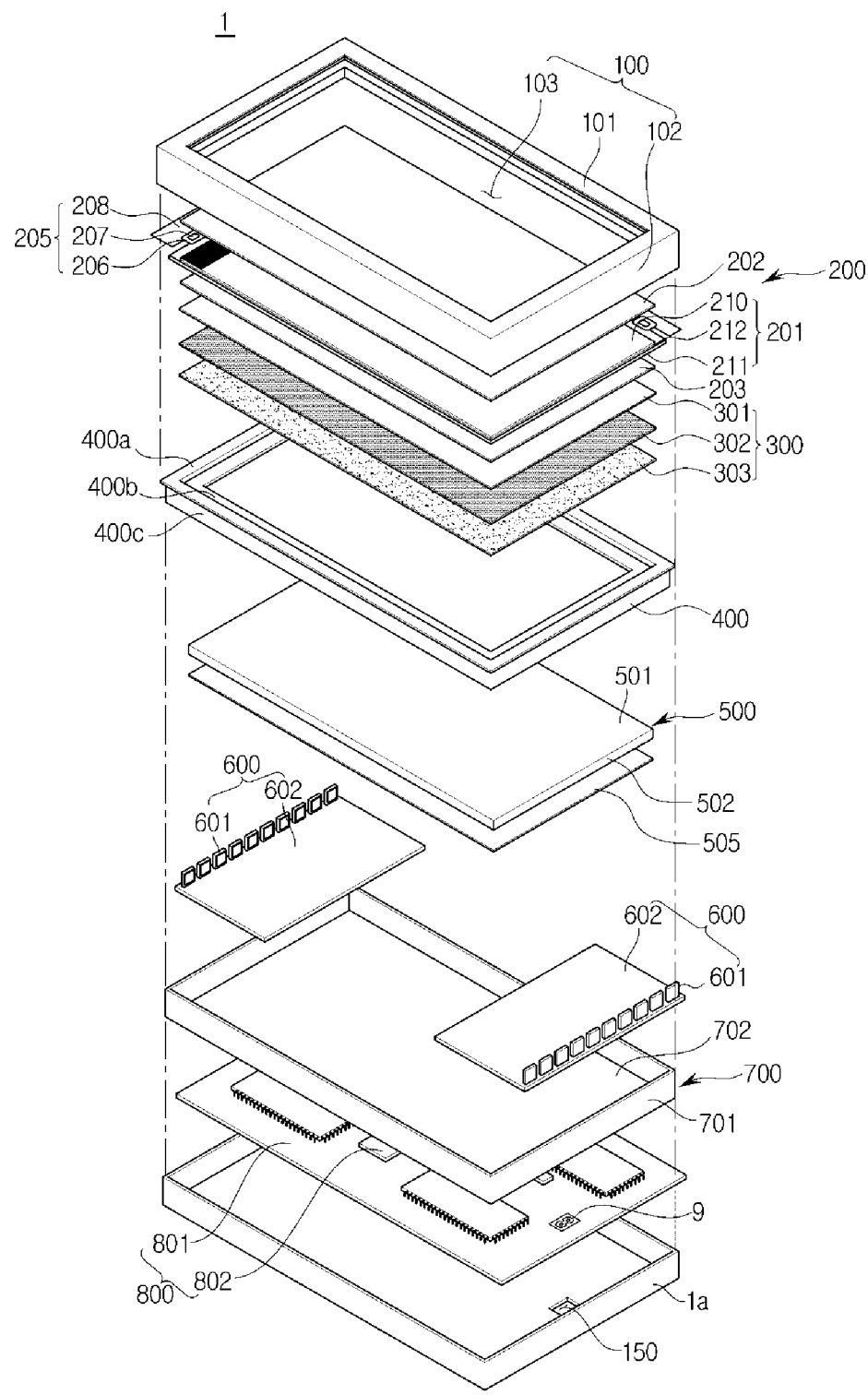
FIG. 13 is an exploded perspective view illustrating the display apparatus according to one embodiment.

FIG. 12 is a perspective view illustrating the display apparatus according to one embodiment, and FIG. 13 is an exploded perspective view illustrating the display apparatus according to one embodiment.

Referring to FIGS. 12 and 13, the display apparatus 1 according to one embodiment includes a top chassis 100, the display panel 200, a backlight unit 600, and a bottom chassis 700. The top chassis 100 is disposed at a front side of the display panel 200. The backlight unit 600 is disposed at a rear side of the display panel 200 to be spaced. The bottom chassis 700 may be disposed at the rear side of the display panel 200 and the backlight unit 600.

A middle mold 400 may be further provided between the display panel 200 and the backlight unit 600. The middle mold 400 allows the display panel 200 to be supported in a state in which the display panel 200 is spaced from the backlight unit 600. A printed circuit board assembly 800 which controls an operation of the display apparatus 1 may be located at a rear side of the bottom chassis 700. The rear cover 1a forming a rear exterior of the display apparatus 1 may be provided at a rear side of the printed circuit board assembly 800.

A plurality of optical sheets 300 may be provided at the rear side of the display panel 200. A light guide panel 500 may be located at a rear side of the optical sheets 300. A reflection sheet 505 may be disposed at a rear side of the light guide panel 500.

The optical sheets 300 include a protective film 301, a prism film 302, and a diffusion film 303. The protective film 301 is disposed at a front side of the prism film 302 to protect the prism film 302 which is sensitive to a scratch due to dust or the like.

A triangular prism-shaped prism may be disposed at a front surface of the prism film 302. By the prism film 302, light diffused by the diffusion film 303 may be concentrated in a direction perpendicular to a rear surface of the display panel 200 disposed at a front side of the diffusion film 303. Two prism films 302 may be used. Light passing through the prism film 302 may be travelled perpendicularly to the display panel 200 so that the display panel 200 has a uniform luminance.

A bead-shaped coating layer may be formed at the diffusion film 303. Light passing through the light guide panel 500 may be diffused by the diffusion film 303, and then may be supplied to the display panel 200.

The light guide panel 500 may allow light emitted from a light emitting diode 601 to be uniformly supplied to the diffusion film 303. The light guide panel 500 may be formed of an acrylic-based resin such as polymethyl methacrylate (PMMA), or polymethylstyrene.

The light guide panel 500 may include a light emitting surface 501 and a light incident surface 502. The light emitting surface 501 may be located at a rear side of the diffusion film 303 to face one surface of the diffusion film 303. The light incident surface 502 may be provided at a side surface so that the light emitted from the light emitting diode 601 is input thereto.

The reflection sheet 505 may be disposed at a rear side of the light guide panel 500. By the reflection sheet 505, light output through a lower surface of the light guide panel 500 may be guided to the light guide panel 500, again. The reflection sheet 505 may be formed of a plastic material such as polyethylene terephthalate (PET) and polycarbonate (PC).

The backlight unit 600 includes a plurality of light emitting diodes 601 and a printed circuit board 602. The light emitting diodes 601 may supply light to the light guide panel 500. The plurality of light emitting diodes 601 may be mounted on the printed circuit board 602.

The plurality of light emitting diodes 601 may be protrudingly mounted on one surface of the printed circuit board 602. The plurality of light emitting diodes 601 may be disposed on one surface of the printed circuit board 602 to be spaced at regular intervals. The plurality of light emitting diodes 601 may be provided at a left or right side of the reflection sheet 505. The plurality of light emitting diodes 601 may emit the light in a direction perpendicular to a protruding direction from the printed circuit board 602. An arrangement of the plurality of light emitting diodes 601 is not limited to the above description. As an example, the plurality of light emitting diodes 601 may be disposed at a front side of the reflection sheet 505 to emit the light toward the light guide panel 500.

The printed circuit board 602 may be located at a rear side of the reflection sheet 505. The printed circuit board 602 may be fixed to the bottom chassis 700 through an adhering means such as a fastening member and a double-sided tape. A surface of the printed circuit board 602 opposed to the surface thereof on which the plurality of light emitting diodes 601 are mounted may be fixed to a bottom surface 702 of the bottom chassis 700.

The light emitting diodes 601 may be configured with a plurality of light emitting diodes which emit white light, or a combination of a plurality of light emitting diodes which emit red light, green light and blue light.

The display panel 200 may include a first substrate 211 having a thin film transistor (TFT) and a pixel electrode, and a second substrate 210 located at one side of the first substrate 211 and having a color filter and a driving source. A liquid crystal layer 212 may be provided between the first and second substrates 211 and 210. Polarizing sheets 22 and 23 may be attached to a lower surface of the first substrate 211 or an upper surface of the second substrate 210. A module having a combination of the first substrate 211, the second substrate 210 and the liquid crystal layer 212 may be referred to as a liquid crystal display module.

A driving part 205 for applying a driving signal may be provided at one side of the first substrate 211. The driving part 205 may include a flexible printed circuit board 206, a driving chip 207 and a circuit board 208. The driving chip 207 may be mounted on one side of the flexible printed circuit board 206. The circuit board 208 may be connected to the other side of the flexible printed circuit board 206.

The flexible printed circuit board 206 may be provided in a chip-on-film (COF) type in which a chip device is mounted on a base film. The flexible printed circuit board 206 may be a tape carrier package (TCP) type using a tape automated bonding (TAP) technique, or a chip-on-glass (COG) type.

Black matrices 213 may be formed at the second substrate 210, and the color filter (not shown) may be formed between the black matrices 213. As an example, the black matrices 213 may be formed of an organic matter including chrome oxide or a black pigment. The color filter may be formed by repeatedly stacking three sub-layers (not shown) which are regularly formed and have three different colors.

The display panel 200 may form a screen by controlling an arrangement of the liquid crystal layer 212. The display panel 200 which is a light non-emission type device may display an image by receiving the light from the backlight unit 600.

The top chassis 100 may include a bezel 101 and a top side surface 102. The bezel 101 may cover an edge of a front surface of the display panel 200. The top side surface 102 may be formed by being bent backward from an end of the bezel 101. At least a part of the top side surface 102 may be in contact with the bottom chassis 700. For example, at least a part of the top side surface 102 may cover an outer surface of a bottom side surface 701.

An opening 103 may be formed at the top chassis 100 to expose the display panel 200. An effective display area in which the image is actually displayed at the display panel 200 may be exposed to the front side through the opening 103.

The bottom chassis 700 may include the bottom side surface 701 and the bottom surface 702. The bottom side surface 701 may protrude and extend to the front side along an edge of the bottom surface 702. The backlight unit 600 may be seated on the bottom surface 702. The printed circuit board assembly 800 which controls the operation of the display apparatus 1 may be disposed at a rear side of the bottom surface 702 of the bottom chassis 700.

The middle mold 400 may include a first support part 400a, a second support part 400b, and an extension part 400c. The first support part 400a and the second support part 400b may be formed to extend to an inside of the middle mold 400. The second support part 400b may extend inward from the first support part 400a, and may also extend to form a step backward from the first support part 400a. The extension part 400c extends to a rear side of the middle mold 400. A part of the display panel 200 may be supported by the first support part 400a. Parts of the optical sheets 300 may be supported by the second support part 400b. An outer surface of the extension part 400c may be in contact with an inner side surface of the bottom chassis 700.

The light emitting diodes 601 may simultaneously emit light and heat. The printed circuit board 602 may serve to not only supply the driving signal to the light emitting diodes 601 but also transfer the heat generated from the light emitting diodes 601 to an outside. That is, the heat generated from the light emitting diodes 601 may be transferred to the bottom chassis 700 side through the printed circuit board 602. To increase heat transfer efficiency, the printed circuit board 602 may be formed of a metal having high heat conductivity. For example, the printed circuit board 602 may be manufactured of a metallic material including aluminum and copper.

The printed circuit board assembly 800 may be installed at the rear side of the bottom chassis 700. The rear cover 1a may be located at the rear side of the printed circuit board assembly 800. The printed circuit board assembly 800 may include a printed circuit board 801, a plurality of electronic components 802 mounted on the printed circuit board 801, and the AC socket 9 to which the connector 20, 20A, 20B is connected.

The electronic components 802 or the AC socket 9 may be mounted on a front or rear surface of the printed circuit board 801. The AC socket 9 may be mounted so that the connection terminal of the AC socket 9 faces the rear cover 1a, and thus the connector is connected to the connection terminal. A hole 150 may be formed at the rear cover 1a so that the connection terminal is exposed to an outside therethrough.

The printed circuit board assembly 800 may drive the display apparatus 1 using a driving force transmitted through the connection terminal. Meanwhile, the plurality of electronic components 802 may be mounted on the printed circuit board 801, or may be fixed by clamps.

Figure 14:
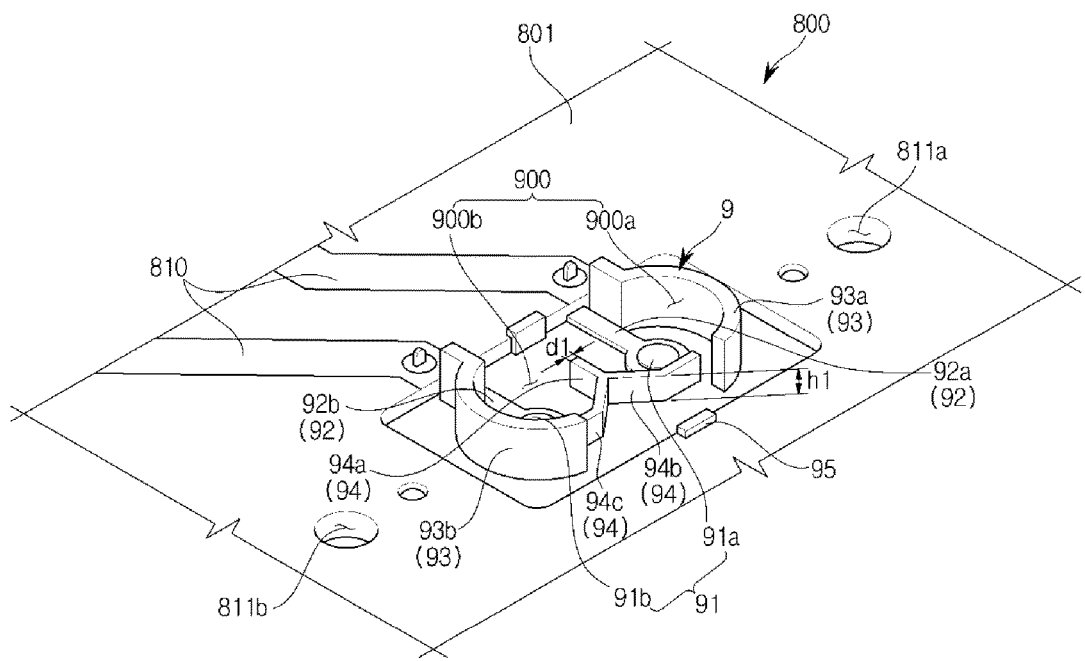
FIG. 14 is a perspective view illustrating a part of a printed circuit board assembly according to one embodiment.
Figure 15:
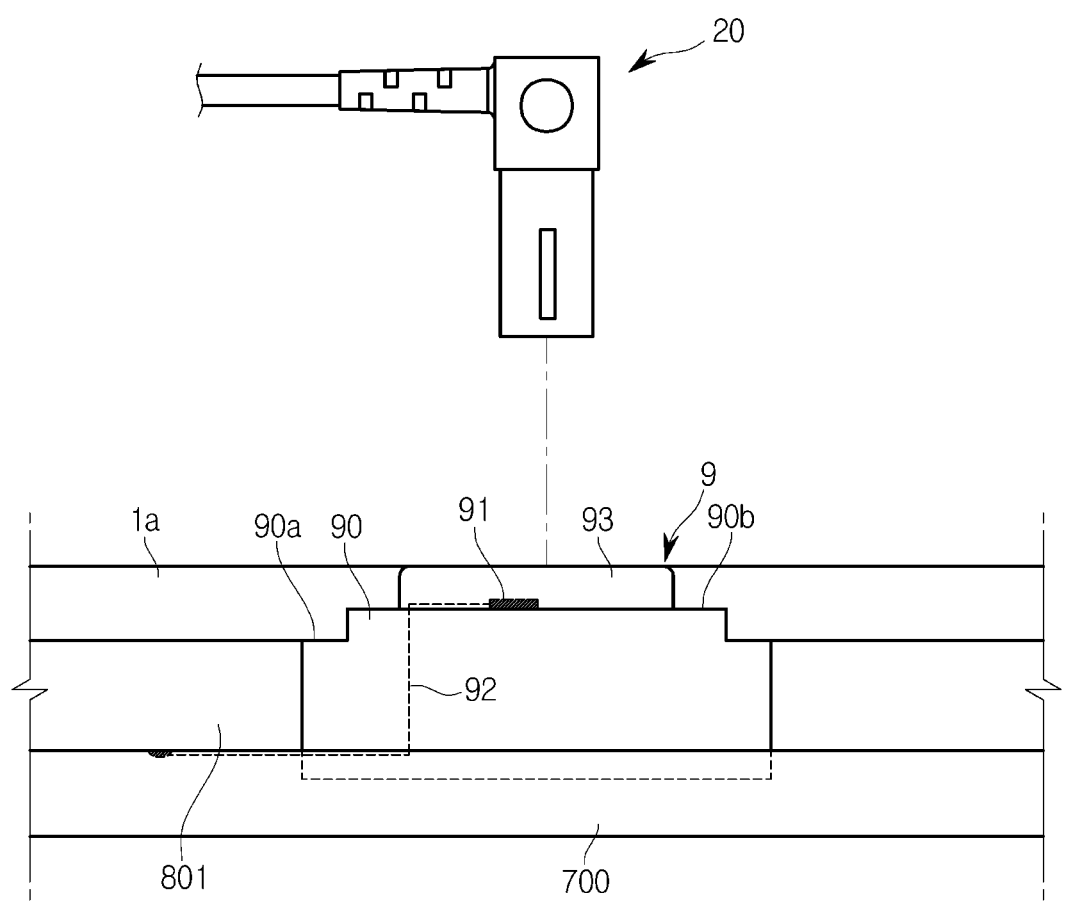
FIG. 15 is a view illustrating an AC socket according to one embodiment, when seen from a side surface thereof.

FIG. 14 is a perspective view illustrating a part of the printed circuit board assembly according to one embodiment, and FIG. 15 is a view illustrating the AC socket according to one embodiment, when seen from a side surface thereof.

Referring to FIGS. 14 and 15, the AC socket 9 may be mounted on the printed circuit board 801 according to one embodiment. The printed circuit board 801 may be formed of an insulating material. A circuit pattern 810 formed of a conductive material may be printed on the printed circuit board 801.

Hereinafter, a side of the rear cover 1a may be referred to as a rear side R, and a side of the bottom chassis 700 may be referred to as a front side F, centering on the printed circuit board 801.

The AC socket 9 may include a socket body 90 and a connection terminal 91. The socket body 90 may be manufactured of an insulating material. The socket body 90 has an accommodation part 900, and the connection terminal 91 may be located at an inside of the accommodation part 900. The connector 20 connected with the external power source may be connected to the connection terminal 91. FIG. 15 illustrates a state in which the connector 20 illustrated in FIGS. 3a to 5 is connected, but the connector illustrated in FIGS. 7 and 10 may be connected, or other type of connectors may be connected thereto.

A step portion 90a may be formed at the rear side R of the socket body 90. The step portion 90a may be provided along an outer circumference of a rear surface 90b of the socket body 90 to be stepped toward the front side. The rear cover 1a may be seated at the step portion 90a. Since the rear cover 1a is provided to be seated at the step portion 90a, the rear cover 1a may be prevented from being moved. Since the rear cover 1a is prevented from being moved, the rear cover 1a may be prevented from pressing the AC socket 9, being in contact with the connector connected with the connection terminal 91, or pressing the connector. Since the rear cover 1a is seated at the step portion 90a, a height of the socket body 90 which protrudes from the rear surface of the printed circuit board 801 may be reduced, compared with a conventional socket body.

Since the step portion 90a is formed at the rear surface of the socket body 90, and the rear cover 1a is seated at the step portion 90a, a length of the socket body 90 in a front and rear direction may be formed shorter than that of a conventional socket body. A length from a side rib 93 provided at the rear surface 90b of the socket body 90 to a front surface 90b may be formed shorter than that from a front surface of the conventional socket to a rear surface thereof.

In the related art, an installation portion at which the bottom chassis is installed is provided at a front side of the socket body to protrude. However, in the embodiments, since the step portion 90a is formed along a front outside of the AC socket 9, and the bottom chassis is installed at the step portion 90a, the height of the socket body 90 in the front and rear direction may be reduced. In general, since the socket body 90 is provided to have the highest height in the printed circuit board assembly 800, a thickness of the display apparatus 1 having the printed circuit board assembly 800 may be reduced by reducing the height of the socket body 90 in the front and rear direction, and thus it is advantageous in providing of a slim display apparatus.

Also, a part of the socket body 90 may be provided to protrude to a rear side of the printed circuit board 801. Since a part of the socket body 90 is provided to protrude to the rear side of the printed circuit board 801, a height of the socket body 90 which protrudes to a front side of the printed circuit board 801 may be reduced. Also, since the height of the socket body 90 which protrudes to the front side of the printed circuit board 801 is reduced, the rear cover 1a may be located closer to the printed circuit board 801 than a conventional rear cover.

The connection terminal 91 may include a first connection terminal 91a and a second connection terminal 91b. The first and second connection terminals 91a and 91b may be provided to be spaced a predetermined distance. The distance between the first and second connection terminals 91a and 91b may be determined according to standards of each country.

The socket body 90 may have the accommodation part 900 in which the first and second connection terminals 91a and 91b are accommodated. The accommodation part 900 may include a first accommodation part 900a in which the first connection terminal 91a is accommodated, and a second accommodation part 900b in which the second connection terminal 91b is accommodated. The first and second accommodation parts 900a and 900b may be formed in one space.

The accommodation part 900 may be formed by the side rib 93 protruding from the rear surface 90b of the socket body 90. The side rib 93 may be formed of an insulating material. The side rib 93 may be formed of the same material as that of the socket body 90. The side rib 93 may include a first side rib 93a located at one side of the first connection terminal 91a, and a second side rib 93b located at one side of the second connection terminal 91b. The first and second connection terminals 91a and 91b may be located in the accommodation part 900 formed by the first and second side ribs 93a and 93b to be spaced the predetermined distance from each other.

A partition 94 may be provided between the first and second connection terminals 91a and 91b. The partition 94 may be manufactured of an insulating material. The partition 94 may be formed of the same material as that of the socket body 90. The partition 94 may be formed to protrude from the rear surface 90b of the socket body 90 located in the accommodation part 900. The partition 94 is provided between the first and second connection terminals 91a and 91b so that the creeping distance between the first and second connection terminals 91a and 91b is increased.

The creeping distance is a length which extends along a surface of an insulator from one electrode to the other electrode, when two certain electrodes are installed at the insulator. As the creeping distance is increased, a high voltage is introduced into the electrode, and thus a possibility that sparks are generated may be reduced.

In the case of the embodiments, since the partition 94 which protrudes to have a predetermined height is provided between the first and second connection terminals 91a and 91 b, the creeping distance may be increased by a length of a surface between the first connection terminal 91a located at a side of the partition 94 and the second connection terminal 91b. The creeping distance may be further increased by a length, in which twice a height h1 of the partition 94 and a thickness d1 of the partition 94 are added, than when the partition 94 is not provided.

The partition 94 may include a first partition 94a which is located between the first and second connection terminals 91a and 91b, a second partition 94b which extends from the first partition 94a and is formed to cover a part of the first accommodation part 900a in which the first connection terminal 91a is located, and a third partition 94c which extends from the first partition 94a and is formed to cover a part of the second accommodation part 900b in which the second connection terminal 91b is located. The second partition 94b and the third partition 94c are branched and extend from the first partition 94a, and thus the partition 94 may be formed in an approximate "Y" shape.

The connection terminal 91 and the circuit pattern 810 of the printed circuit board 801 may be connected with each other by a connection member 92 formed of a conductive material. The connection member 92 may extend from the rear surface 90b of the socket body 90 to the circuit pattern 810 provided on a front surface of the printed circuit board 801. The connection member 92 may be fixed at a position which is spaced a predetermined distance from one side surface of the socket body 90. One end of the connection member 92 may be fixed to the connection terminal 91, and other end thereof may be fixed to the printed circuit board 801 by soldering or the like.

A clamp 95 may be provided at one side surface of the socket body 90. The clamp 95 may be provided at each opposed surface of the socket body 90. The socket body 90 may be fixed to the printed circuit board 801 by the clamp 95. The clamp 95 may fix the socket body 90 to the printed circuit board 801 through a hooking method.

The printed circuit board 801 may have through-holes 811a and 811b through which a fastening member passes. The through-holes 811a and 811b may be provided at both sides opposed to each other centering on the socket body 90. Each of the through-holes 811a and 811b may be provided to be spaced a predetermined distance from a side surface of the socket body 90 at which the clamp 95 is not provided.

For example, the through-holes 811a and 811b may be provided on a straight line which connects the first connection terminal 91a with the second connection terminal 91b. The through-holes 811a and 811b may include a first through-hole 811a which is located at a side of the first connection terminal 91a, and a second through-hole 811b which is located at a side of the second connection terminal 91b. The fastening member may pass through the through-holes 811a and 811b and then may be fastened to a first coupling part 96 of the socket body 90 which will be described later.

Figure 16:
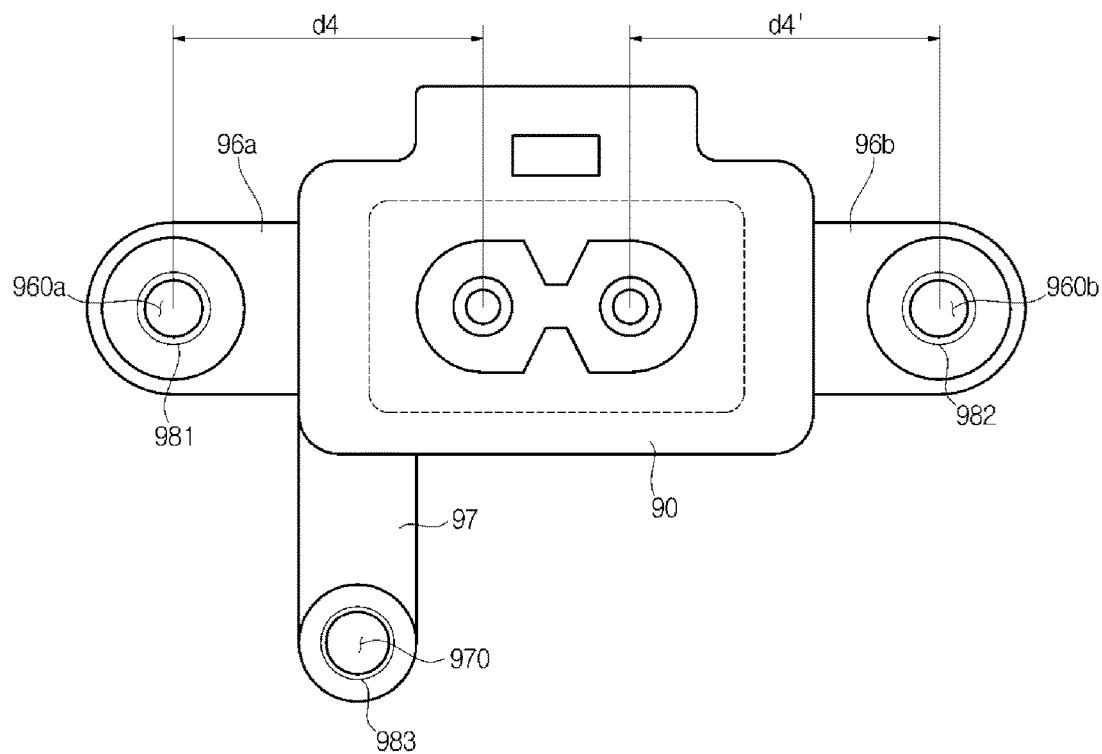
FIG. 16 is a view illustrating the AC socket according to one embodiment, when seen from a front side thereof.
Figure 17:
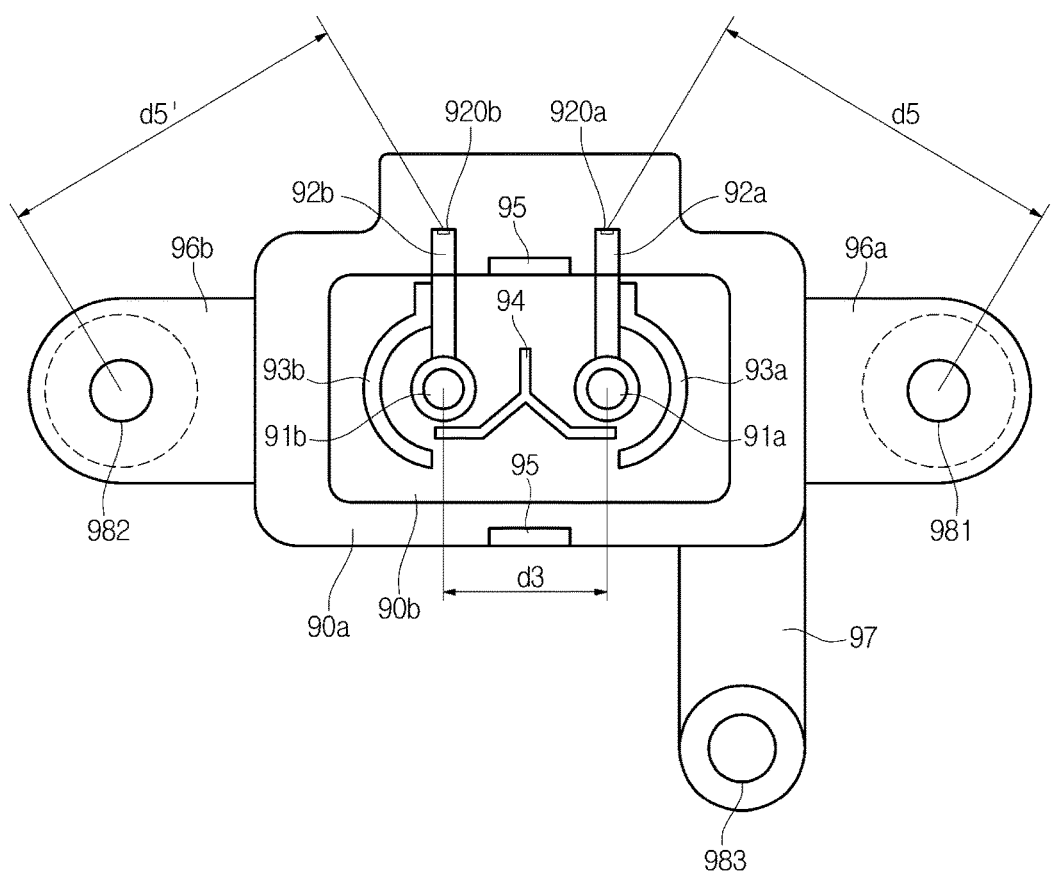
FIG. 17 is a view illustrating the AC socket according to one embodiment, when seen from a rear side thereof.

FIG. 16 is a view illustrating the AC socket according to one embodiment, when seen from a front side thereof, and FIG. 17 is a view illustrating the AC socket according to one embodiment, when seen from a rear side thereof.

Referring to FIGS. 16 and 17, the AC socket 9 according to one embodiment may include the first coupling parts 96a and 96b which fix the AC socket 9 to the bottom chassis 700, and a second coupling part 97 which fixes the AC socket 9 to the rear cover 1a. The first coupling parts 96a and 96b and the second coupling part 97 may be provided to extend from the side surface of the socket body 90.

A plurality of first coupling parts 96a and 96b may be provided. The first coupling part 96 may be provided to extend from each of opposed side surfaces of the socket body 90. The first coupling part 96 includes a first coupling part 96a which is located at the side of the first connection terminal 91a, and a first coupling part 96b which is located at the side of the second connection terminal 91b.

The first coupling parts 96a and 96b may have fastening holes 960a and 960b in which fastening members 981 and 982 are inserted. The fastening members 981 and 982 may pass through the through-holes 811a and 811b formed at the printed circuit board 801, the fastening holes 960a and 960b formed at the first coupling parts 96a and 96b, and the hole (not shown) formed at the bottom chassis 700, and may couple the printed circuit board 801, the AC socket 9 and the bottom chassis 700 with each other. The fastening member passing through the first fastening hole 960a may be referred to as a first fastening member 981, and the fastening member passing through the second fastening hole 960b may be referred to as a second fastening member 982. The fastening members may be screws formed of a conductive material.

Like the first coupling parts 96a and 96b, the second coupling part 97 may be provided to extend from the side surface of the socket body 90. An extension direction of the second coupling part 97 may be perpendicular to extension directions of the first coupling parts 96a and 96b. The second coupling part 97 may have a fastening hole 970 through which a third fastening member 983 passes. The third fastening member 983 may pass through the fastening hole 970 and then may be fastened to the rear cover 1a. The third fastening member 983 may be a screw formed of a conductive material.

A distance d3 between the first connection terminal 91a and the second connection terminal 91b may be determined according to standards of each country. The creeping distance between the first connection terminal 91a and the first fastening member 981 is longer than a space distance d4 between the first connection terminal 91a and the first fastening member 981 due to the side rib 93a located between the first connection terminal 91a and the first fastening member 981. Similarly, the creeping distance between the second connection terminal 91b and the second fastening member 982 is longer than a space distance d4' between the second connection terminal 91b and the second fastening member 982 due to the side rib 93b located between the second connection terminal 91b and the second fastening member 982. Here, the space distance is the shortest distance between a conductor and another conductor.

The creeping distance in the AC socket is determined according to standards of each country. Therefore, like in the embodiments, when the side ribs 93a and 93b are located, the creeping distance is provided longer than the space distance, and thus a size of the AC socket 9 may be reduced, while the predetermined creeping distance is ensured.

As illustrated in FIG. 3, the connection member 92 may extend from the rear surface 90b of the socket body 90, and then may be bent and extend at the front surface 90b, and the other ends 920a and 920b thereof may be fixed to one surface of the printed circuit board 801 by soldering or the like. The other ends 920a and 920b of the connection member 92 may be located to be spaced a predetermined distance from the connection terminals 91a and 91b. The creeping distances d5 and d5' between the other ends 920a and 920b of the connection member 92 and the first and second fastening members 981 and 982 may be provided longer than the creeping distances d4 and d4' between the first and second fastening members 981 and 982 and the first and second connection terminals 91a and 91 b. Since the creeping distances d5 and d5' between the other ends 920a and 920b of the connection member 92 and the first and second fastening members 981 and 982 may be provided longer than the creeping distances d4 and d4' between the first and second fastening members 981 and 982 and the first and second connection terminals 91a and 91b, the possibility that sparks are generated may be further reduced, even when the high voltage flows.

In the case of the embodiments, since the height of the AC socket 9 is provided lower than that of a conventional AC socket, the height of the printed circuit board assembly 800 in the front and rear direction in which the AC socket 9 is mounted, i.e., a thickness thereof may be realized smaller than that of a conventional printed circuit board assembly. Therefore, it is advantageous in providing of the slim display apparatus 1. Also, when the printed circuit board assembly 800 is manufactured, packed and transported, the number of the printed circuit board assemblies 800 which may be stacked in the same space is increased, and thus a transporting cost may be reduced.

According to one embodiment, the height of the AC socket protruding to the rear side of the printed circuit board can be reduced, and thus it is possible to realize the slim electronic device to which the printed circuit board is applied. Also, the printed circuit board has the slim thickness, and thus it is advantageous in packing and transporting of the printed circuit board. Also, since the creeping distance is increased, it is possible to enhance stability of the printed circuit board.

Also, according to one embodiment, it is possible to minimize the protruding of a connection portion between the electronic product and the power cord, and thus to enhance the external appearance. Also, the coherence of the connection portion between the electronic product and the power cord can be enhanced, and the movement of the power cord can be prevented, and thus it is possible to prevent the arc generated by the external influence. Also, it is possible to be stably installed at the electronic product, and thus to enhance the durability of the electronic product.

Although a few embodiments have been shown and described, it would be appreciated by those skilled in the art that changes may be made in these embodiments without departing from the principles and spirit of the embodiments, the scope of which is defined in the claims and their equivalents.

What is claimed is:

1. An AC socket which is mounted on a printed circuit board provided at a display apparatus, comprising:
    a socket body having a step portion formed along an outer circumference of a rear surface of the socket body to seat a rear cover of the display apparatus thereon, the rear surface of the socket body facing the rear cover of the display apparatus;
    a connection terminal provided at the socket body on the rear surface; and
    a connection member configured to connect the connection terminal with a circuit pattern provided at the printed circuit board,
    wherein a rib configured to protrude from the rear surface of the socket body toward a rear side of the display apparatus is provided at the rear surface of the socket body.

2. The AC socket according to claim 1, wherein the rib is integrally injection-molded with the socket body using an insulating material.

3. The AC socket according to claim 1, wherein at least one coupling part through which a fastening member passes is provided to extend from one side of the socket body.

4. The AC socket according to claim 1, wherein the rear surface of the socket body is provided to further protrude toward a rear side more than the step portion.

5. The AC socket according to claim 1, wherein, when the socket body is mounted on the printed circuit board, a part of the socket body protrudes to a front side of the printed circuit board.

6. The AC socket according to claim 1, wherein the connection terminal comprises a first connection terminal, and a second connection terminal spaced from the first connection terminal.

7. The AC socket according to claim 6, wherein a distancing partition is provided between the first connection terminal and the second connection terminal.

8. The AC socket according to claim 7, wherein the distancing partition is integrally injection-molded with the socket body using an insulating material.

9. The AC socket which is mounted on a printed circuit board provided at a display apparatus, comprising:
    a socket body having a step portion formed along an outer circumference of a rear surface of the socket body to seat a rear cover of the display apparatus thereon;
    a connection terminal provided at the socket body; and
    a connection member configured to connect the connection terminal with a circuit pattern provided at the printed circuit board,
    wherein a rib configured to protrude from an outside of the connection terminal toward a rear side is provided at the rear surface of the socket body,
    wherein the connection terminal comprises a first connection terminal, and a second connection terminal spaced from the first connection terminal,
    wherein a distancing partition is provided between the first connection terminal and the second connection terminal,
    wherein the distancing partition comprises:
    a first partition located between the first and second connection terminals,
    a second partition configured to extend from the first partition and to cover a part of a first accommodation part in which the first connection terminal is located, and
    a third partition configured to extend from the first partition and to cover at least a part of a second accommodation part in which the second connection terminal is located.

10. The AC socket which is mounted on a printed circuit board provided at a display apparatus, comprising:
    a socket body having a step portion formed along an outer circumference of a rear surface of the socket body to seat a rear cover of the display apparatus thereon;
    a connection terminal provided at the socket body; and
    a connection member configured to connect the connection terminal with a circuit pattern provided at the printed circuit board,
    wherein a rib configured to protrude from an outside of the connection terminal toward a rear side is provided at the rear surface of the socket body,
    wherein at least one coupling part through which a fastening member passes is provided to extend from one side of the socket body,
    wherein the at least one coupling part comprises a first coupling part provided at a first surface of the socket body and a second surface thereof facing the first surface, and the first coupling part is coupled to the rear cover by the fastening member.

11. The AC socket according to claim 10, wherein a partition configured to protrude from the rear surface of the socket body is provided between the connection terminal and the first coupling part.

12. The AC socket according to claim 10, wherein the at least one coupling part comprises a second coupling part configured to extend from a side surface located between the first and second surfaces of the socket body, and the second coupling part is coupled to a bottom chassis by the fastening member.

13. The AC socket according to claim 12, wherein a partition configured to protrude from the rear surface of the socket body is provided between the connection terminal and the second coupling part.

14. A display apparatus, comprising:
    a display panel configured to display an image;
    a rear chassis at which the display panel is seated;
    a printed circuit board provided at a rear side of the rear chassis and having a circuit pattern printed thereon;
    an AC socket mounted on the printed circuit board; and
    a rear cover provided at a rear side of the printed circuit board, wherein the AC socket comprises:
- a socket body having a step portion formed along an outer circumference of a rear surface of the socket body to seat the rear cover thereon to prevent a movement of the rear cover;
- a connection terminal provided at the rear surface of the socket body;
- a coupling part configured to extend from a side surface of the socket body and to be coupled to one of the rear chassis and the rear cover; and
- a connection member configured to connect the connection terminal with the circuit pattern provided at the printed circuit board.

15. The display apparatus according to claim 14, wherein the connection terminal comprises a first connection terminal, and a second connection terminal formed spaced from the first connection terminal, and a partition formed of an insulation material is provided between the first and second connection terminals.

16. The display apparatus according to claim 14, wherein a clamp fixed to the printed circuit board is provided at the socket body.

17. The display apparatus according to claim 14, wherein the rear cover has a hole, and the connection terminal provided at the socket body is exposed to an outside through the hole.

18. The display apparatus according to claim 14, wherein a partition is formed at the rear surface of the socket body to cover at least a part of an accommodation part in which the connection terminal is located.

19. The display apparatus according to claim 18, wherein the partition is integrally injection-molded with the socket body using an insulating material.

20. A power connector for an electronic device, comprising:
- a first power connection terminal;
- a second power connection terminal spaced apart from the first terminal by a space distance set by a country standard; and
- a partition between the first power connection terminal and the second power connection terminal and having a surface distance extending along any surface between the first power connection terminal and the second power connection terminal greater than the space distance between first power connection terminal and the second power connection terminal set by a country standard, wherein the partition comprises:
- a first partition located between the first and second power connection terminals,
- a second partition configured to extend from the first partition and to cover a part of a first accommodation part in which the first power connection terminal is located, and
- a third partition configured to extend from the first partition and to cover at least a part of a second accommodation part in which the second power connection terminal is located.

21. A connector according to claim 20, wherein the partition has a "y" shape.

22. A connector according to claim 20, further comprising:
- a first fastening member adjacent the first power connection terminal; and
- a rib between the first fastening member and the first power connection terminal increasing a creeping distance between the first fastening member and the first power connection terminal.

* * * * *